United States Patent [19]

Roberts

[11] Patent Number: 4,818,951

[45] Date of Patent: Apr. 4, 1989

[54] GAIN CONTROL OR MULTIPLIER CIRCUITS

[75] Inventor: John H. Roberts, Hickory, Miss.

[73] Assignee: Peavey Electronics Corporation, Meridian, Miss.

[21] Appl. No.: 180,003

[22] Filed: Apr. 11, 1988

[51] Int. Cl.$^4$ .......................... H03F 3/45; G06G 7/24
[52] U.S. Cl. .................................... 330/254; 307/492; 330/285
[58] Field of Search .................... 307/492; 328/149; 330/129, 130, 131, 133, 254, 278, 285, 85, 257

[56] References Cited

U.S. PATENT DOCUMENTS

| | | | |
|---|---|---|---|
| 4,225,794 | 9/1980 | Buff | 307/492 X |
| 4,335,361 | 6/1982 | Acker | 330/254 X |
| 4,341,962 | 7/1982 | Buff | 307/492 |

Primary Examiner—Steven Mottola
Attorney, Agent, or Firm—Huff & Associates

[57] ABSTRACT

This invention concerns, in a current-controlled amplifier circuit, the combination of output amplifier means having an input conductor and having an output conductor for converting a signal at the input conductor of the output amplifier means to a current amplified signal, feedback means connected between the output and input conductors of the output amplifier means and including a differential pair of semiconductors having a control current output, for presenting a signal at the input conductor of the output amplifier means which is the product of an input signal to the amplifier circuit and the ratio of a reference current to the control current and for substantially eliminating dc input at the input conductor of the output amplifier means and setting the quiescent currents of the semiconductors of the differential pair substantially equal.

14 Claims, 2 Drawing Sheets

GAIN CONTROL OR MULTIPLIER CIRCUITS

BACKGROUND AND BRIEF SUMMARY OF THE INVENTION

The invention relates to gain control or multiplier circuits of the type having an ac signal input and an amplified ac signal output wherein the output signal waveform is a current controlled amplified version of the input waveform. In particular, this invention is applicable to circuits employing antilog processing of ac signals.

The use of balanced semiconductor pairs is well known in the art and is widely practiced in the field of lower performance integrated circuit gain elements. These circuits generally suffer from poor control voltage rejection due to mismatches in the base-emitter voltages of differential pairs of semiconductors of the circuit and are limited in dynamic range due to the requirement that the input differential pair stage must be operated at a quiescent current in excess of the greatest input signal expected. Currently, the art deals with these limitations, though inadequately, by (a) integrating the transistors of a differential pair onto a common substrate to assure good matching at the expense of dynamic range because of the small geometry of the transistors used, or (b) using selected large geometry discrete transistors and trimming out the voltage offsets.

The invention disclosed and claimed herein is directed to current controlled amplifier systems or multiplier systems which overcome the aforementioned disadvantages. In particular, this invention utilizes a low pass filtered feedback means around the output stage of what may be an otherwise conventional dual differential pair multiplier so as automatically to compensate for mismatched base-emitter voltage offsets of the semiconductors forming the differential pair associated with the output amplifier stage.

In one aspect, this invention concerns, in a current-controlled amplifier circuit, the combination of output amplifier means having an input conductor and having an output conductor for converting a signal at the input conductor of the output amplifier means to a current amplified signal, feedback means connected between the output and input conductors of the output amplifier means and including a differential pair of semiconductors having a control current output, for presenting a signal at the input conductor of the output amplifier means which is the product of an input signal to the amplifier circuit and the ratio of a reference current to the control current and for substantially eliminating dc input at the input conductor of the output amplifier means and setting the quiescent currents of the semiconductors of the differential pair substantially equal.

In particular, in accord with the preceding object, the invention involves feedback means which includes a low pass filter circuit connected as an input to the differential pair. Further, the feedback circuit also includes a current mirror circuit associated with the differential pair. Still further, the output amplifier means is provided with a high pass filter feedback circuit.

More specifically, this invention concerns a current-controlled amplifier circuit comprising the combination of input amplifier means having an input conductor for receiving an input signal of ac waveform and having an output conductor, feedback means connected between the output and input conductors of the input amplifier means and including a first differential pair of semiconductors having a reference current output port, for creating an output waveform at the output conductor of the input amplifier means which is the product of the input signal and the reference current, output amplifier means having an input conductor and having an output conductor for converting a signal at the input conductor of the output amplifier means to a current amplified version of the input signal waveform, second feedback means connected between the output and input conductors of the output amplifier means and including a differential pair of semiconductors having a control current output, for multiplying the output signal of the input amplifier means by the control current to present a signal at the input conductor of the output amplifier means which is the product of the input signal at the input conductor of the input amplifier means and the ratio of the reference current to the control current and for substantially eliminating dc input at the input conductor of the output amplifier means and setting the quiescent currents of the semiconductors of the second differential pair substantially equal.

Still more specifically, this invention is concerned with a current-controlled amplifier circuit comprising the combination of input amplifier means having an input conductor for receiving an input signal of ac waveform and having an output conductor, feedback means connected between the output and input conductors of the input amplifier means for creating an output waveform at the output conductor of the input amplifier means which is the product of the input signal and the reference current, the feedback means comprising parallel branches in which one branch comprises the current path of one semiconductor of a differential pair having an output port for the reference current and a fixed value input port connected to the one semiconductor, and the other branch comprising a current path of the other semiconductor of the differential pair in series with a current mirror, the other semiconductor having an input port connected with the output conductor of the input amplifier means, output amplifier means having an input conductor and having an output conductor, second feedback means connected between the output and input conductors of the output amplifier means for multiplying the output signal of the input amplifier means by the control current to present a signal at the input conductor of the output amplifier means which is the product of the input signal at the input conductor of the input amplifier means and the ratio of reference current to the control current, the second feed back means comprising parallel branches in which one branch comprises the current path of one semiconductor of a second differential semiconductor pair having a control current output port and an input port of one semiconductor of the second differential pair which is connected to the output conductor of the input amplifier means, and the other branch comprising the current path of the other semiconductor of the second differential pair in series with a current mirror and low pass filter means connected to an input port of the other semiconductor of the second differential pair for substantially eliminating dc input at the input conductor of the output amplifier means and for setting the quiescent currents of the semiconductors of the second differential pair substantially equal, and high pass feedback means across the output amplifier means for converting the signal at the input conductor of the output amplifier means to a current amplified version of the input signal waveform.

These and other objects of this invention will appear more clearly from the detailed description which follows.

BRIEF DESCRIPTION OF THE DRAWING FIGURES

FIG. 1 is a block schematic view illustrating the principles of this invention; and FIG. 2 is a detailed schematic of a preferred embodiment of the invention.

DETAILED DESCRIPTION OF THE INVENTION

Figure 1:
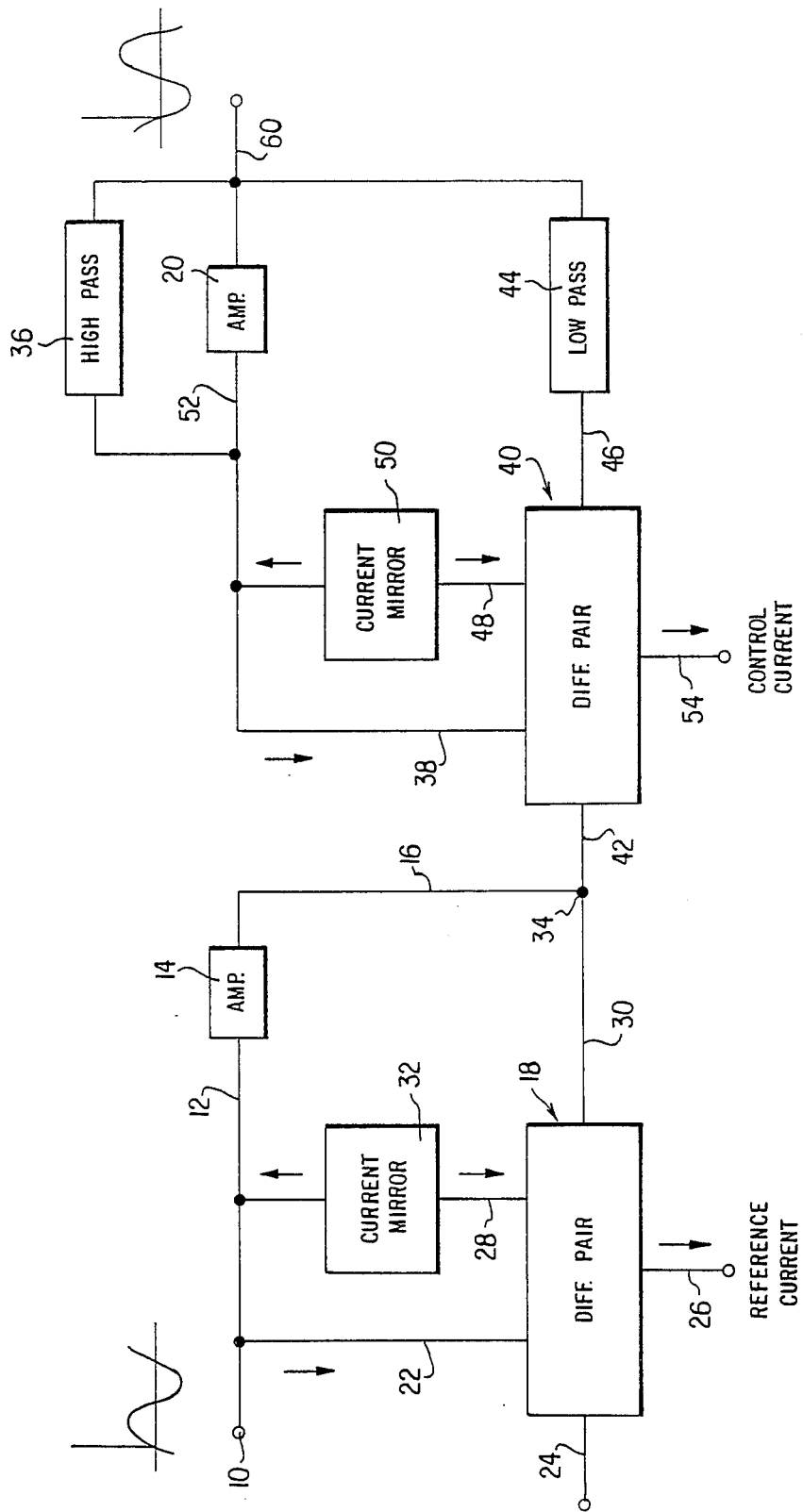

Referring at this time to FIG. 1, a diagrammatic multiplier circuit system is illustrated therein. As shown, the circuit includes an input terminal 10 to which an input signal of ac waveform is applied, substantially in accord with the waveform illustrated immediately above this terminal. This signal is applied to the input conductor 12 of the input amplifier means 14, whose output conductor 16 is connected to the differential semiconductor pair indicated at 18 and which is associated with the output amplifier means 20, as shown.

The input amplifier means is provided with feedback means which is in the form of parallel branches connected between the output conductor 16 of the input amplifier means and the input conductor 12 of the input amplifier means 14. One branch comprises the current path 22 of one semiconductor of the differential semiconductor pair 18 (current paths as indicated by the arrows) and which one semiconductor is provided with the base controlling input port 24, the pair 18 having the reference current output port 26 as indicated. The other branch comprises the current path 28 of the other semiconductor of the pair 18, which has the base control input port 30 connected to the output conductor 16, in series with the current mirror circuit 32. The amplifier means 14 with the differential pair 18 and the current mirror circuit 32 oppose the signal applied at the terminal 10 and create a signal waveform at the junction 34 which is the product of the input signal at 10 and the reference current at 26.

The output stage amplifier means 20 has two feedback means associated therewith, the high pass feedback means 36 whose function is later described, and the low pass feedback means comprised of the parallel branches of which one is the current path 38 of one semiconductor of the differential pair 40 and which has the base controlling input port 42 connected to the junction 34, and the other branch of which is through the low pass filter means 44 from the output conductor 60 applied to the base controlling input port 46 of the other semiconductor of the pair 40 and the current path 48 of such other semiconductor in series with the current mirror circuit 50. The differential pair 40 with the current mirror circuit 50 present a signal at the input conductor 52 of the output amplifier means 20 which is the product of the input signal at 10 and the ratio of the reference current at 28 to the control current at 54 which is the control current output port of the differential pair 40.

The high pass feedback means 36 converts the signal at the input conductor 52 to a current controlled amplified signal at the output conductor 60 which is the current amplified version of the input signal at 10. This amplified output signal is illustrated immediately above the output conductor 60. The low pass feedback means 44 varies the base controlling input port 46 of the pair 40 to eliminate dc current at the input conductor 52 of the output amplifier means and thus sets equal quiescent currents in the semiconductors of the pair 40.

Figure 2:
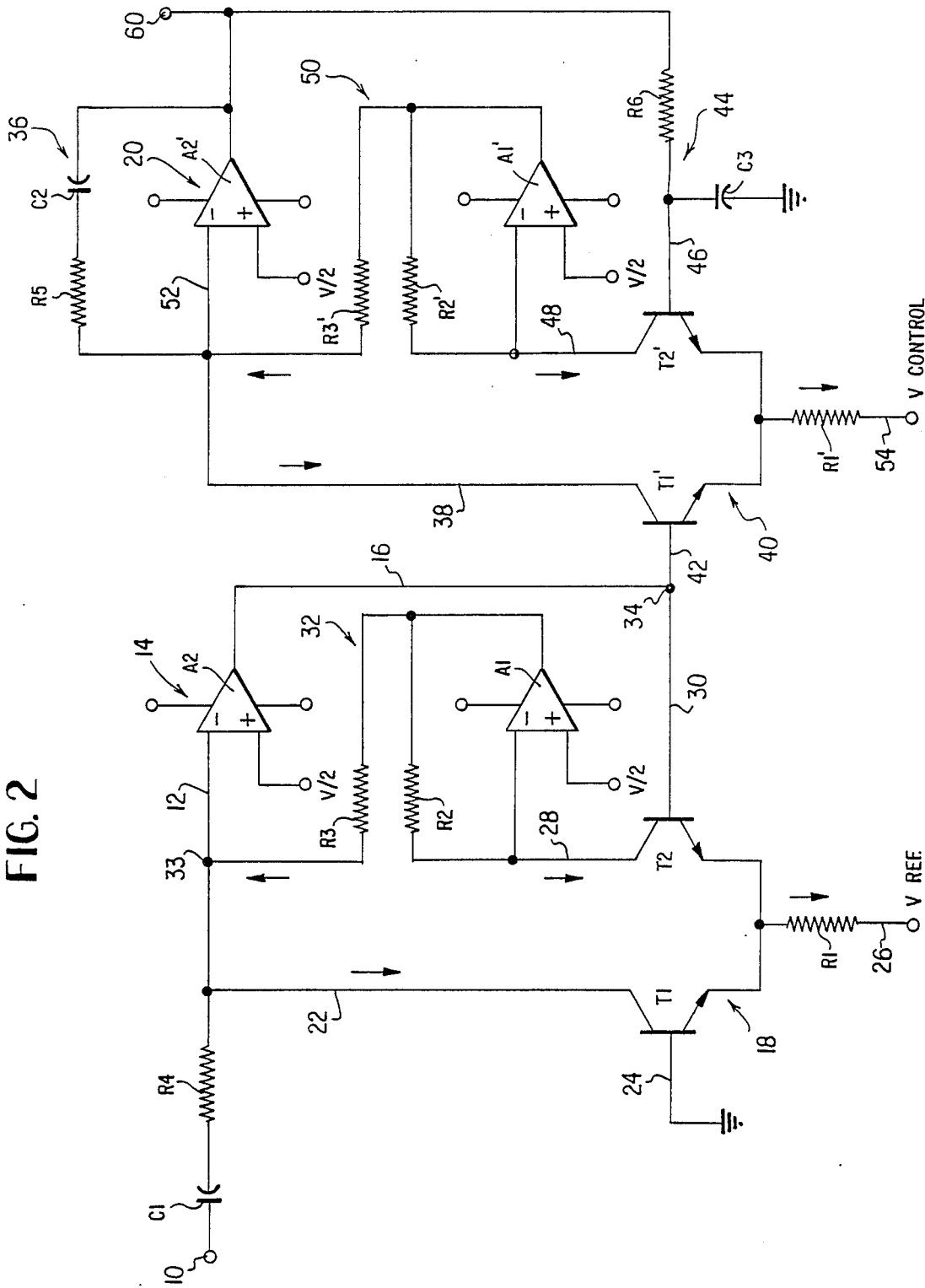

A preferred embodiment of the invention is illustrated in FIG. 2 and in order to correlate FIGS. 1 and 2, the reference characters of FIG. 1 have been applied with general indicator lead lines to the corresponding elements of FIG. 2. Thus, the input and output amplifier means 14 and 20 are seen to be operational amplifiers having their inverting input terminals connected to the conductors 12 and 52 respectively. The two differential pairs 18 and 40 each are comprised of the transistors T1 and T2 or the transistors T3 and T4, the base electrode of the transistor T1 being connected to ground through the input port 24, its emitter electrode being connected in common with the emitter electrode of the transistor T2 and to the V REF. terminal through the resistor R1 to pass the reference current, and its collector electrode being connected to the input conductor 12 of the amplifier means 14 to define the current path 22. The collector electrode of the transistor T2 is likewise connected to the current mirror 32 to define the current path 28 and the current mirror 32 comprises the operational amplifier A1 having its inverting input electrode connected to the conductor 28 and its non-inverting input electrode connected to the voltage source V/2. The input voltage signal applied to the input terminal 10 is converted by the capacitor C1 and resistor R4 to an input current at the virtual ground input 3 of the operational amplifier A2 (14) connected to the inverting input electrode of this amplifier A2, the non-inverting input electrode being connected to the voltage source V/2. The configuration of the current mirror circuit 32 is completed by the feedback resistor R2 and the current-limiting output resistor R3.

In the output stage, the configuration is the same as in the input stage, except as noted below, and corresponding elements are indicated therein by primed reference characters. It should be noted at this point that the values of all of the resistors R1-R3' may be the same, for example 20K ohms, that all of the amplifiers A1-A2' may be of the same type, and that all of the transistors T1-T2' may be of the same type.

The output operational amplifier A2' is provided with a high pass feedback means comprised of the capacitor C2 and the resistor R5 for the antilog conversion of the logarithmic signal at the junction 34, as is well understood by those in the art. The output stage is also provided with the low pass filter means comprised of the capacitor C3 and the resistor R6. As was described generally before, the low pass filter means 44 varies the base electrode input to the transistor T2' to eliminate dc current at the input to the amplifier A2' and sets the quiescent base-emitter currents in the transistors T1' and T2' equal, thus compensating any mismatch in base-emitter offset voltages of these transistors.

It will be appreciated that the teachings of this invention are applicable to any circuit employing antilog processing of ac signals.

In considering this invention, the above disclosure is intended to be illustrative only and the scope and coverage of the invention should be construed and determined by the following claims.

What is claimed is:

1. In a current-controlled amplifier circuit, the combination of output amplifier means having an input conductor and having an output conductor for converting a signal at the input conductor of the output amplifier means to a current amplified signal, feedback means connected between the output and input conductors of the output amplifier means and including a differential pair of semiconductors having a control current output, for presenting a signal at the input conductor of the output amplifier means which is the product of an input signal to the amplifier circuit and the ratio of a reference current to the control current and for substantially eliminating dc input at the input conductor of the output amplifier means and setting quiescent base-emitter currents of the semiconductors of the differential pair substantially equal.

2. In a current-controlled amplifier circuit as defined in claim 1 wherein the feedback means includes a low pass filter circuit connected as an input to the differential pair.

3. In a current-controlled amplifier circuit as defined in claim 2 wherein the feedback circuit also includes a current mirror circuit associated with the differential pair.

4. A current-controlled amplifier circuit comprising the combination of input amplifier means having an input conductor for receiving an input signal of ac waveform and having an output conductor, feedback means connected between the output and input conductors of the input amplifier means and including a first differential pair of semiconductors having a reference current output port, for creating an output waveform at the output conductor of the input amplifier means which is the product of the input signal and the reference current, output amplifier means having an input conductor and an output conductor for converting a signal at the input conductor of the output amplifier means to a current amplified version of the input signal waveform, second feedback means connected between the output and input conductors of the output amplifier means and including a differential pair of semiconductors having a control current output, for multiplying the output signal of the input amplifier means by the control current to present a signal at the input conductor of the output amplifier means which is the product of the input signal at the input conductor of the input amplifier means and the ratio of the reference current to the control current and for substantially eliminating dc input at the input conductor of the output amplifier means and setting the quiescent base-emitter currents of the semiconductors of the second differential pair substantially equal.

5. A current-controlled amplifier circuit as defined in claim 4 wherein the second feedback means includes a low pass filter circuit connected as an input to the second differential pair.

6. In a current-controlled amplifier circuit as defined in claim 5 wherein the second feedback circuit also includes a current mirror circuit associated with the second differential pair.

7. A current-controlled amplifier circuit comprising the combination of input amplifier means having an input conductor for receiving an input signal of ac waveform and having an output conductor, current mirror controlled feedback means connected between the output and input conductors of the input amplifier means and including a first differential pair of semiconductors having a reference current output port, for creating an output waveform at the output conductor of the input amplifier means which is the product of the input signal and the reference current, output amplifier means having an input conductor and an output conductor and high pass feedback means across the output amplifier means for converting a signal at the input conductor of the output amplifier means to a current amplified signal of the input signal waveform, current mirror controlled second feedback means connected between the output and input conductors of the output amplifier means and including a second differential pair of semiconductors having a control current output port, for multiplying the output signal of the input amplifier means by the control current to present a signal at the input conductor of the output amplifier means which is the product of the input signal at the input conductor of the input amplifier means and the ratio of the reference current to the control current and for substantially eliminating dc input at the input conductor of the output amplifier means and setting the quiescent base-emitter currents of semiconductors of the second differential pair substantially equal.

8. A current-controlled amplifier circuit as defined in claim 7 wherein the second feedback means includes a low pass filter circuit connected as an input to the second differential pair.

9. In a current-controlled amplifier circuit as defined in claim 8 wherein the second feedback circuit also includes a current mirror circuit associated with the second differential pair.

10. A current-controlled amplifier circuit comprising the combination of input amplifier means having an input conductor for receiving an input signal of ac waveform and having an output conductor, feedback means connected between the output and input conductors of the input amplifier means for creating an output waveform at the output conductor of the input amplifier means which is the product of the input signal and the reference current, the feedback means comprising parallel branches in which one branch comprises the current path of one semiconductor of a differential pair having an output port for the reference current and a fixed value input port connected to the one semiconductor, and the other branch comprising a current path of the other semiconductor of the differential pair in series with a current mirror, the other semiconductor having an input port connected with the output conductor of the input amplifier means, output amplifier means having an input conductor and having an output conductor, second feedback means connected between the output and input conductors of the output amplifier means for multiplying the output signal of the input amplifier means by the control current to present a signal at the input conductor of the output amplifier means which is the product of the input signal at the input conductor of the input amplifier means and the ratio of reference current to the control current, the second feed back means comprising parallel branches in which one branch comprises the current path of one semiconductor of a second differential semiconductor pair having a control current output port and an input port of one semiconductor of the second differential pair which is connected to the output conductor of the input amplifier means, and the other branch comprising the current path of the other semiconductor of the second differential pair in series with a current mirror and low pass filter means connected to an input port of the other semiconductor of the second differential pair for substantially eliminating dc input at the input conductor of the output amplifier means and for setting quiescent base-emitter currents of the semiconductors of the second differential pair substantially equal, and high pass feedback means across the output amplifier means for converting the signal at the input conductor of the output amplifier means to a current amplified version of the input signal waveform.

11. In a an antilog processing circuit for ac signals having an output amplifier means having an input conductor and an output conductor, feedback means comprising a differential pair of semiconductors each having a base electrode input port, low pass filter means and current mirror means connected between the input and output conductors, the base electrode input port of one semiconductor of the differential pair being connected to the output port through said low pass filter means for automatically setting quiescent base-emitter currents of the differential pair equal.

12. In a processing circuit for ac signals comprising the combination of an input amplifier stage having an input conductor and an output conductor, feedback means connected between the input and output conductors employing a differential pair of semiconductors in association with current mirror means for converting an ac input signal at the input conductor to current amplified logarithmic form at the output conductor, and an output amplifier stage having an input conductor and an output conductor, second feedback means connected between the input and output conductors of the output amplifier stage employing a further differential pair of semiconductors, each having a base electrode input port, in association with further current mirror means for providing a current amplified antilog output signal at the output conductor of the output amplifier stage, the base electrode input port of one semiconductor of the further differential pair being connected to the output conductor of the input amplifier stage and the base electrode input port of the remaining semiconductor of the further differential pair being connected to the output conductor of the output amplifier stage through said low pass filter means for automatically setting quiescent base-emitter currents of the further differential pair equal.

13. In a processing circuit as defined in claim 12 wherein the transistors of the input stage differential pair are transistors capable of operating at a quiescent current in excess of the greatest input signal expected.

14. In a processing circuit as defined in claim 13 wherein the current mirror means of the input stage is identical in construction to the current mirror means of the output stage.

* * * * *